United States Patent
Pan et al.

(10) Patent No.: US 10,177,077 B2
(45) Date of Patent: Jan. 8, 2019

(54) CHIP STRUCTURE HAVING REDISTRIBUTION LAYER

(71) Applicant: Powertech Technology Inc., Hsinchu County (TW)

(72) Inventors: Chi-Liang Pan, Hsinchu County (TW); Ting-Feng Su, Hsinchu County (TW)

(73) Assignee: Powertech Technology Inc., Hsinchu County (TW)

(*) Notice: Subject to any disclaimer, the term of this patent is extended or adjusted under 35 U.S.C. 154(b) by 0 days.

(21) Appl. No.: 15/671,156

(22) Filed: Aug. 8, 2017

(65) Prior Publication Data
US 2018/0301396 A1    Oct. 18, 2018

(30) Foreign Application Priority Data

Apr. 13, 2017   (TW) .............................. 106112332 A

(51) Int. Cl.
| | | |
|---|---|---|
| *H01L 23/482* | (2006.01) | |
| *H01L 23/00* | (2006.01) | |
| *H01L 23/31* | (2006.01) | |

(52) U.S. Cl.
CPC ...... *H01L 23/4824* (2013.01); *H01L 23/3114* (2013.01); *H01L 24/04* (2013.01); *H01L 24/07* (2013.01); *H01L 2224/0235* (2013.01)

(58) Field of Classification Search
CPC . H01L 23/4824; H01L 24/07; H01L 23/3114; H01L 24/04; H01L 2224/0235; H01L 23/522; H01L 23/5226; H01L 23/485; H01L 23/53295
See application file for complete search history.

(56) References Cited

U.S. PATENT DOCUMENTS

| | | | |
|---|---|---|---|
| 6,358,836 B1 | 3/2002 | Lu et al. | |
| 6,605,525 B2 | 8/2003 | Lu et al. | |
| 8,026,608 B2 | 9/2011 | Sabatini et al. | |
| 8,796,561 B1 | 8/2014 | Scanlan et al. | |
| 2014/0035127 A1* | 2/2014 | Hirtreiter | H01L 21/283 257/737 |
| 2017/0287839 A1* | 10/2017 | Lee | H01L 21/56 |

FOREIGN PATENT DOCUMENTS

TW    201312663    3/2013

* cited by examiner

*Primary Examiner* — Sonya D. McCall-Shepard
(74) *Attorney, Agent, or Firm* — JCIPRNET

(57) ABSTRACT

A chip structure including a chip and a redistribution layer is provided. The chip includes a plurality of pads. The redistribution layer includes a dielectric layer and a plurality of conductive traces. The dielectric layer is disposed on the chip and has a plurality of contact windows located above the pads. The conductive traces are located on the dielectric layer and are electrically coupled to the pads through the contact windows. At least one of the conductive traces includes a body and at least one protrusion coupled to the body, and the at least one protrusion is coupled to an area of the body other than where the contact windows are coupled to on the body.

20 Claims, 9 Drawing Sheets

CHIP STRUCTURE HAVING REDISTRIBUTION LAYER

CROSS-REFERENCE TO RELATED APPLICATION

This application claims the priority benefit of Taiwan application Ser. No. 106112332, filed on Apr. 13, 2017. The entirety of the above-mentioned patent application is hereby incorporated by reference herein and made a part of this specification.

BACKGROUND OF THE INVENTION

1. Field of the Invention

The invention relates to a chip structure. More particularly, the invention relates to a chip structure having a redistribution layer.

2. Description of Related Art

With the development of integrated circuits, working frequencies of chips become higher and higher (i.e., electronic signals are transmitted faster and faster), and thereby, the quality of the electronic signals is most important for data to be transmitted smoothly. In chip structure design field, the meander line layout routing method is adopted most of the time to perform equal length design control. As such, physical lengths of the electronic signal traces in the chip are almost identical, and that transmission quality of the electronic signals (i.e., performing timing control) is further enhanced. Nevertheless, the meander line layout routing method may be limited by the size or area of a chip, and redistribution layer may become relatively complicated.

Therefore, how to further enhance the quality of high-speed transmission of the electronic signals through trace design has become an important issue nowadays.

SUMMARY OF THE INVENTION

The invention provides a chip structure including a chip and a redistribution layer. The chip includes a plurality of pads. The redistribution layer includes a dielectric layer and a plurality of conductive traces. The dielectric layer is deposited on the chip and has a plurality of contact windows located above the pads. The conductive traces are disposed on the dielectric layer and are electrically coupled to the pads through the contact windows. At least one of the conductive traces includes a body and at least one protrusion coupled to the body, and the at least one protrusion is coupled to an area of the body other than where the contact windows is coupled to the body.

In view of the foregoing, timing control of the conductive traces may be adjusted as required in design through adjusting the protrusions of the conductive traces.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Generally, signal transmission time required for an electronic signal to propagate all conductive traces is called delay time. Delay time of each of the conductive traces may be closely related to the equivalent parasitic capacitance and/or the equivalent parasitic inductance of each of the conductive traces. Delay time may be presented by Equation (1):

$$\tau_i = \sqrt{C_i L_i} \qquad (1)$$

The $\tau_i$ is the delay time of the i-th conductive trace, $C_i$ is the equivalent parasitic capacitance of the i-th conductive trace, and $L_i$ is the equivalent parasitic inductance of the i-th conductive trace. The equivalent parasitic capacitance of each of the conductive traces is related to each of the conductive traces in the chip structure and the thickness of the dielectric layer between the conductive traces and the chip. Moreover, the equivalent parasitic inductance of each of the conductive traces is related to the thickness of each of the conductive traces. Thereby, in the embodiments of the invention, based on the body of each of the general conductive traces, the equivalent parasitic capacitance and/or equivalent parasitic inductance of each of the conductive traces may be adjusted through at least one protrusion on the body of the conductive trace being adjusted. Delay time for electronic signal transmission of each of the conductive traces in the chip structure may be calculated through the Equation (1), such that delay times of the conductive traces in the chip structure are matched with each other. The chip structure and each of the conductive traces in the chip structure are further described as follows.

Figure 1:
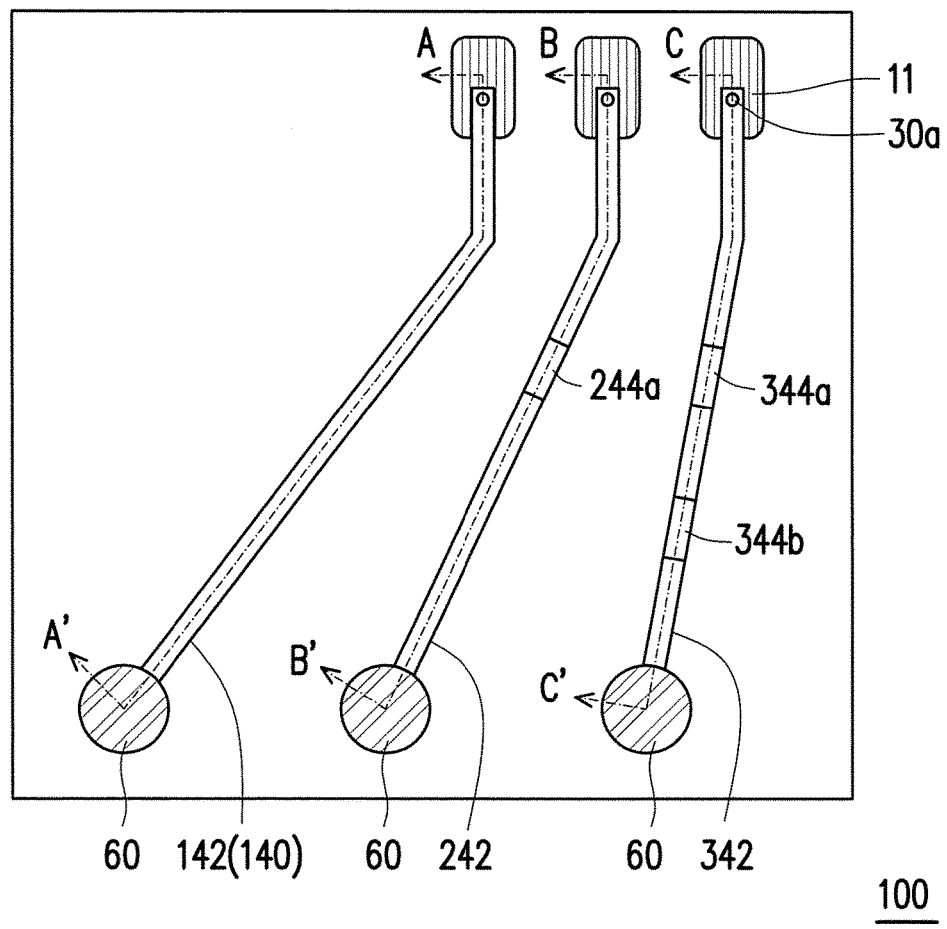
FIG. 1 is a partial top view of a chip structure according to the first embodiment of the present invention.
Figure 2A:
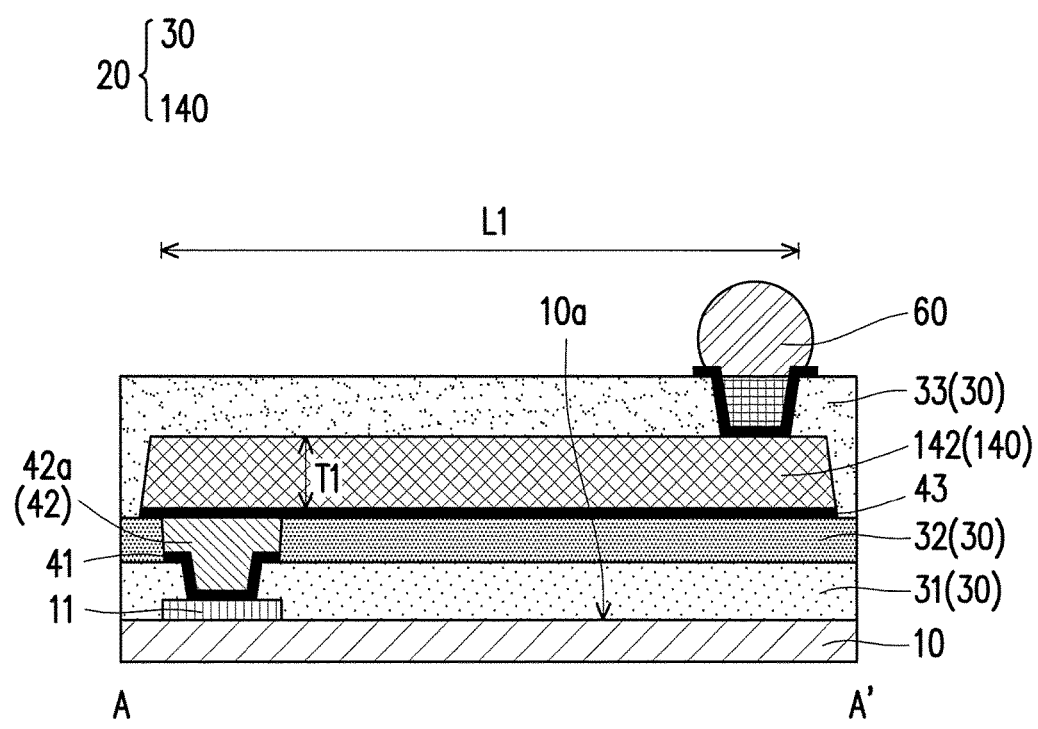
FIG. 2A is a schematic cross-sectional view of the chip structure in FIG. 1 taken along a cross-sectional line A-A'.
Figure 2B:
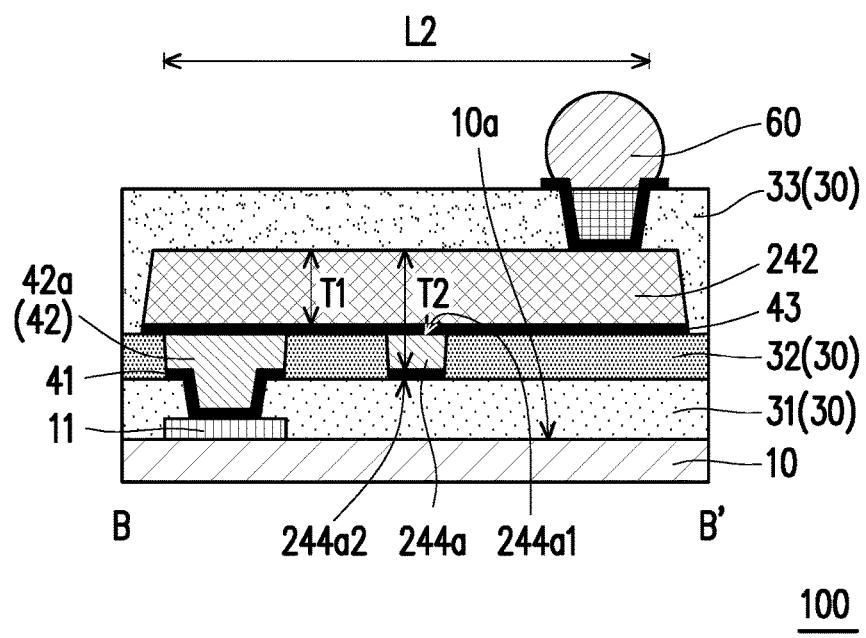
FIG. 2B is a schematic cross-sectional view of the chip structure in FIG. 1 taken along a cross-sectional line B-B'.
Figure 2C:
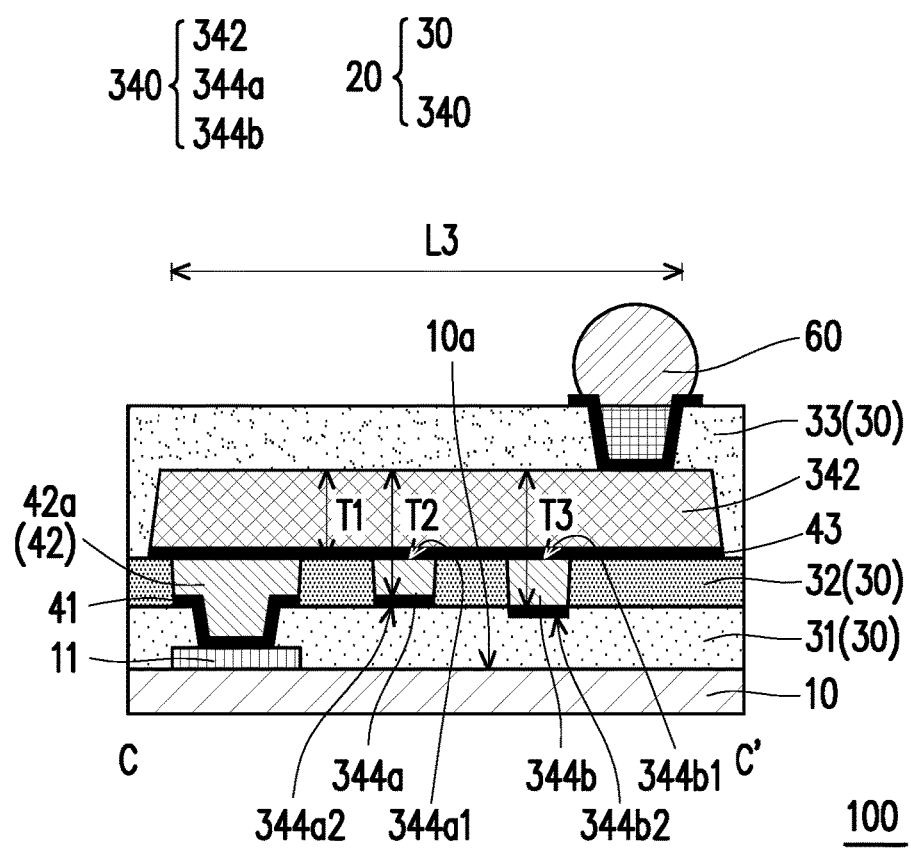
FIG. 2C is a schematic cross-sectional view of the chip structure in FIG. 1 taken along a cross-sectional line C-C'.

FIG. 1 is a partial top view of a chip structure according to the first embodiment of the present invention. FIG. 2A is a schematic cross-sectional view of a chip structure 100 in FIG. 1 taken along a cross-sectional line A-A'. FIG. 2B is a schematic cross-sectional view of the chip structure 100 in FIG. 1 taken along a cross-sectional line B-B'. FIG. 2C is a schematic cross-sectional view of the chip structure 100 in FIG. 1 taken along a cross-sectional line C-C'. A chip 10 and a dielectric layer 30 are not shown in FIG. 1 in order to clearly illustrate changes of a length and routing of each of the conductive traces. In order to show relations of relative locations and numbers between a body of each of the conductive traces (e.g., a first body 142 of a first conductive trace 140, a second body 242 of a second conductive trace 240, and/or a third body 342 of a third conductive trace 340) and each of the protrusions (e.g., a first protrusion 244a included in the second conductive trace 240 and/or a second protrusion 344a and a third protrusion 344b included in the third conductive trace 340), blocks are merely used to simply show example locations of the protrusions. In addition, in FIG. 2A to FIG. 2C, a location of each of the conductive traces disposed on the dielectric layer 30, an inclined angle between each of the conductive traces and a contact surface of the dielectric layer 30, a length of a protrusion, and a thickness of a protrusion are merely exemplary and are not limited to the illustrations of the figures. In the present embodiment, each of the conductive traces is merely disposed on an active surface 10a of the chip 10 to overlap with the active surface 10a of the chip 10. In the rest of the embodiments, each of the conductive traces may be disposed not only on the active surface 10a of the chip 10 but also be extended beyond the periphery of the active surface 10a of the chip 10.

FIG. 2A is a cross-sectional view of the first conductive trace 140 of the present embodiment, FIG. 2B is a cross-sectional view of the second conductive trace 240 of the present embodiment, and FIG. 2C is a cross-sectional view of the third conductive trace 340 of the present embodiment. Referring to FIG. 1 and FIG. 2A to FIG. 2C, the chip structure 100 includes the chip 10 and a redistribution layer 20. The chip 10 includes a plurality of pads 11. The redistribution layer 20 includes the dielectric layer 30 and a plurality of conductive traces 140, 240, 340. The dielectric layer 30 is disposed or formed on the chip 10 and has a plurality of contact windows 30a located above the pads 11 of the chip 10. The conductive traces 140, 240, 340 are disposed on the dielectric layer 30 and are electrically coupled to the corresponding pads 11 through the corresponding contact windows 30a. Each of the conductive traces 140, 240, 340 includes a body, and at least one of the conductive traces 240, 340 further includes at least one protrusion coupled to the body. The at least one protrusion may be coupled to an area of the body other than where the contact windows 30a is coupled to on the body. In the present embodiment, the number of the conductive traces is exemplified as three, but the invention is not limited thereto.

In the present embodiment, the dielectric layer 30 of redistribution layer 20 may include a first dielectric layer 31, a second dielectric layer 32, and a third dielectric layer 33. Moreover, the first dielectric layer 31, the second dielectric layer 32, and/or the third dielectric layer 33 may be formed by same or different materials or recipes. The body of each of the conductive traces may include a third conductive layer 43 and a fourth conductive layer 44. Moreover, the third conductive layer 43 and the fourth conductive layer 44 may be formed by different manufacturing methods and materials, but the invention is not limited thereto. A protrusion of at least one of the conductive traces may include a first conductive layer 41 and a second conductive layer 42. Moreover, the first conductive layer 41 and the second conductive layer 42 may be formed by different manufacturing methods and materials, but the invention is not limited thereto.

In some embodiments, the number of the conductive traces may be two, and lengths of the two conductive traces are different from each other. One conductive trace of the two conductive traces with a shorter length includes a body and at least one protrusion coupled to the body. The protrusion may be disposed on the body of the conductive trace other than the area of the body where the contact window 30a is disposed. The other conductive trace of the two conductive traces with a longer length may include merely a body or includes the body and at least one protrusion coupled to the body. The delay time for the two conductive traces may be substantially the same after the forming of the at least one protrusion on the conductive trace(s). In another embodiment, the protrusion included by the conductive trace in the two conductive traces with a shorter length has a larger volume (e.g., the protrusion having thicker thickness and/or longer length) than the protrusion of the longer conductive trace. The protrusion included by the conductive trace in the two conductive traces with a longer length has a smaller volume (e.g., the protrusion having thiner thickness and/or shorter length) than the protrusion of the shorter conductive trace.

In another embodiment, regardless of the number of conductive traces, a volume of the protrusion included by the shorter conductive trace may be larger than that of the protrusion included by the longer conductive trace.

As shown in FIG. 1 and FIG. 2A, the first conductive trace 140 includes the first body 142. The first body 142 has a first length L1 and a first thickness T1. An end of the first body 142 overlaps with the pad 11 of the chip 10, such that the end of the first body 142 overlapping with the pad 11 may be electrically coupled to the pad 11 through the contact window 30a disposed on the pad 11.

As shown in FIG. 1 and FIG. 2B, the second conductive trace 240 includes the second body 242 having a second length L2 and the first protrusion 244a coupled to the second body 242. An end of the second body 242 overlaps with the pad 11 of the chip 10, such that the end of the second body 242 overlapping with the pad 11 may be electrically coupled to the pad 11 through the contact window 30a located on the pad 11. The first protrusion 244a has a first mend 244a1 that may be coupled to an area of the body other than where the contact window 30a is coupled to on the body. The first protrusion 244a may extend downward from the second body 242 (towards the chip 10) and has a second end 244a2 (opposite to the first end 244a1) that is encapsulated in the dielectric layer 30.

In the present embodiment, a thickness of the second body 242 may be identical to the thickness of the first body 142, i.e. the second body has the first thickness T1. But the invention is not limited thereto. A region of the second conductive trace 240 where the first protrusion 244a is disposed may have a second thickness T2. In other words, the total thickness of the second body 242 and a thickness of the first protrusion 244a coupled to the second body 242 is equal the second thickness T2.

In the present embodiment, the number of the first protrusion 244a is exemplified as one, and the contact window 30a and the first protrusion 244a are disposed on a same side of the second body 242 (e.g., the side of the second body 242 facing towards the chip 10). But the invention is not limited thereto. In other embodiments, the second conductive trace 240 may include a plurality of the first protrusions 244a. In another embodiment, the contact window 30a and the first protrusion 244a may be disposed on two opposite sides of the second body 242 (e.g., the contact window 30a is located on the side of the second body 242 facing towards the chip 10, and the first protrusion 244a is located on the side of the second body 242 facing away from the chip 10, not shown).

The first length L1 of the first body 142 of the first conductive trace 140 may be longer than the second length L2 of the second body 242 of the second conductive trace 240. As such, the equivalent parasitic capacitance and/or equivalent parasitic inductance of the second conductive trace 240 may be adjusted through the first protrusion 244a coupled to the second body 242, and that a delay time of the second conductive trace 240 and a delay time of the first conductive trace 140 may be matched with each other.

As shown in FIG. 1 and FIG. 2C, the third conductive trace 340 includes the third body 342 having a third length L3, the second protrusion 344a coupled to the third body 342, and the third protrusion 344b coupled to the third body 342. An end of the third body 342 overlaps with the pad 11 of the chip 10, such that the end of the third body 342 overlapping with the pad 11 may be electrically coupled to the pad 11 through the contact window 30a located on the pad 11. A first end 344a1 of the second protrusion 344a and a first end 344b1 of the third protrusion 344b may be coupled to areas of the body other than where the contact window 30a is coupled to on the body. The second protrusion 344a and the third protrusion 344b extend downward from the third body 342 (towards the chip 10) and have second ends 344a2 and 344b2, respectively, where the second end 344a2 of the second protrusion 344a and the second end 344b2 of the third protrusion 344b are encapsulated in the dielectric layer 30.

In the present embodiment, a thickness of the third body 342 may be identical to the thickness of the first body 142, i.e. the third body 342 and the first body 142 both have the first thickness T1. But the invention is not limited thereto. A region of the third conductive trace 340 where the second protrusion 344a is deposed may have the second thickness T2, and a region of the third conductive trace 340 where the third protrusion 344b is deposited may have a third thickness T3. In other words, the total thickness of the third body 342 and a thickness of the second protrusion 344a coupled to the third body 342 is equal the second thickness T2, and the total thickness of the third body 342 and a thickness of the third protrusion 344b coupled to the third body 342 is equal the third thickness T3. In the present embodiment, the second thickness T2 may be thinner than the third thickness T3, and a contact area between the second protrusion 344a and the third body 342 is identical to a contact area between the third protrusion 344b and the third body 342. As such, a volume of the second protrusion 344a is different from a volume of the third protrusion 344b. In the rest of the embodiments, the second thickness T2 and the third thickness T3 may be identical, and the contact area between the second protrusion 344a and the third body 342 and the contact area between the third protrusion 344b and the third body 342 may be different, such that the volume of the second protrusion 344a is different from the volume of the third protrusion 344b.

In the present embodiment, the number of the second protrusion 344a and the number of the third protrusion 344b are both exemplified as one, and the contact window 30a and the second protrusion 344a and the contact window 30a and the third protrusion 344b are located on a same side of the third body 342 (e.g., the side of the third body 342 facing towards the chip 10). But the invention is not limited thereto. In the rest of the embodiments, the third conductive trace 340 may include a plurality of the second protrusions 344a and/or a plurality of the third protrusions 344b. In another embodiment, the contact window 30a and the second protrusion 344a are located on two opposite sides of the third body 342 (e.g., the contact window 30a is located on the side of the third body 342 facing towards the chip 10, and the second protrusion 344a is located on the side of the third body 342 facing away from the chip 10, not shown). In still another embodiment, the contact window 30a and the third protrusion 344b are located on two opposite sides of the third body 342 (e.g., the contact window 30a is located on the side of the third body 342 facing towards the chip 10, and the third protrusion 344b is located on the side of the third body 342 facing away from the chip 10, not shown).

In the present embodiment, the second length L2 of the second body 242 of the second conductive trace 240 may be longer than the third length L3 of the third body 342 of the third conductive trace 340. As such, the equivalent parasitic capacitance and/or equivalent parasitic inductance of the third conductive trace 340 may be adjusted through the second protrusion 344a and the third protrusion 344b coupled to the third body 342, and that a delay time of the third conductive trace 340 and the delay time of the second conductive trace 240 may be matched with each other.

FIG. 3A to FIG. 3H are schematic cross-sectional views of a manufacturing process of a chip structure according to an embodiment of the invention. In order to provide clear illustration and better explanation, the schematic cross-sectional views of a manufacturing process in FIG. 3A to FIG. 3H are exemplified as a manufacturing process of the second conductive trace 240 of the chip structure 100 according to an embodiment of the invention.

Figure 3A:
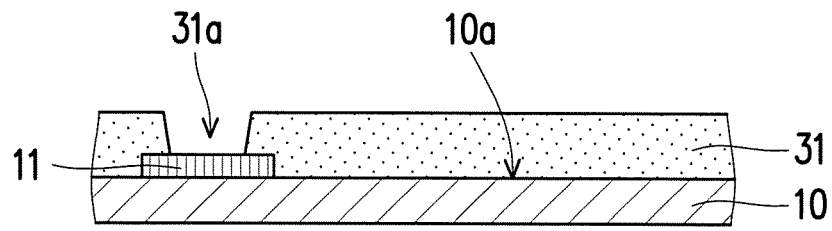
FIG. 3A to FIG. 3H are schematic cross-sectional views of a manufacturing process of a chip structure according to the first embodiment of the invention.

The manufacturing method of the chip structure 100 provided by the present embodiment include following steps. First, referring to FIG. 3A, the chip 10 is provided, and the active surface 10a of the chip 10 has a plurality of pads 11. It is worth noting that only one of the pads 11 is schematically illustrated in FIG. 3A. The first dielectric layer 31 is disposed or formed on the active surface 10a of the chip 10. The first dielectric layer 31 has a plurality of first through holes 31a to expose the pads 11 of the chip 10. In the present embodiment, the first dielectric layer 31 may be patterned through the photolithography process and the etching process. A material of the first dielectric layer 31 includes polyimide (PI) or other similar dielectric materials, but the invention is not limited thereto.

Figure 3B:
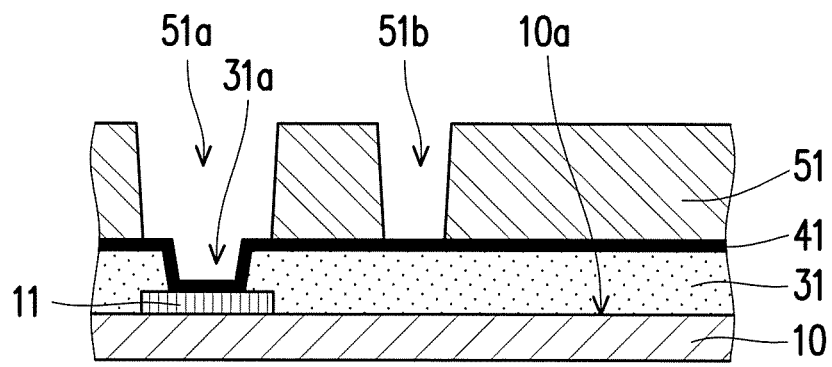

Next, referring to FIG. 3B, the first conductive layer 41 is comprehensively formed on the first dielectric layer 31 and the pad 11, and the first conductive layer 41 is conformal with the first dielectric layer 31. In the present embodiment, the first conductive layer 41 is, for example, a seed layer formed by sputtering deposition. A common seed layer may be a titanium material layer and/or a copper material layer; nevertheless, the actual material of the seed layer is based on the conductive material to be filled in the first through holes 31a in the following.

Next, a first photoresist layer 51 is formed on the first conductive layer 41. The first photoresist layer 51 covers a part of the first conductive layer 41. The first photoresist layer 51 may be formed by the photolithography process. The first photoresist layer 51 has a plurality of openings corresponding to the pads 11 to expose the part of the first conductive layer 41 located above the pads 11. In the present embodiment, the openings of the first photoresist layer 51 include a plurality of first openings 51a and at least one second opening 51b. Each of the first openings 51a is respectively corresponding to each of the pads 11 of the chip 10, and the at least one second opening 51b is located away from each of the pads 11 of the chip 10. In other words, each of the first openings 51a is located above each of the first through holes 31a of the first dielectric layer 31, and the at least one second opening 51b is not located above the first through holes 31a. It is worth noting that only one first opening 51a and one second opening 51b are schematically illustrated in FIG. 3B; nevertheless, the numbers of the first opening 51a and the second opening 51b included in the first photoresist layer 51 may be numbers other than one. In the rest of the embodiments, the number of the second opening 51b may be plural, and the second openings 51b may have different opening areas.

Figure 3C:
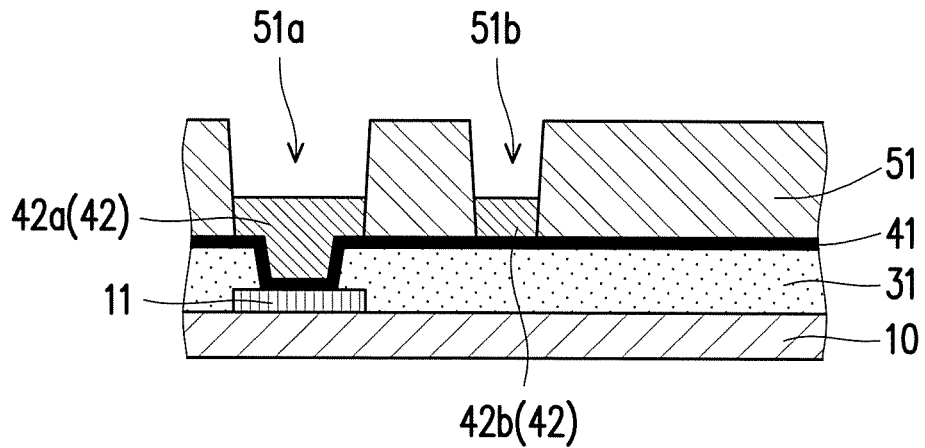

Referring to FIG. 3C, after the first photoresist layer 51 is formed, the second conductive layer 42 is formed on the first conductive layer 41 exposed by the first opening 51a and the second opening 51b. The second conductive layer 42 may be formed on the first conductive layer 41 through electroplating. A material of the second conductive layer 42 may be identical to the material of the first conductive layer 41, but the invention is not limited thereto. In the present embodiment, as shown in FIG. 3C, the second conductive layer 42 includes a first portion 42a and a second portion 42b. The first portion 42a of the second conductive layer 42 is located in the first opening 51a of the first photoresist layer 51, and the second portion 42b of the second conductive layer 42 is located in the second opening 51b of the first photoresist layer 51. It is worth noting that only one first portion 42a and one second portion 42b of the second conductive layer 42 are schematically illustrated in FIG. 3C; nevertheless, the numbers of the first portion 42a and the second portion 42b of in the second conductive layer 42 may be numbers other than one.

Figure 3D:
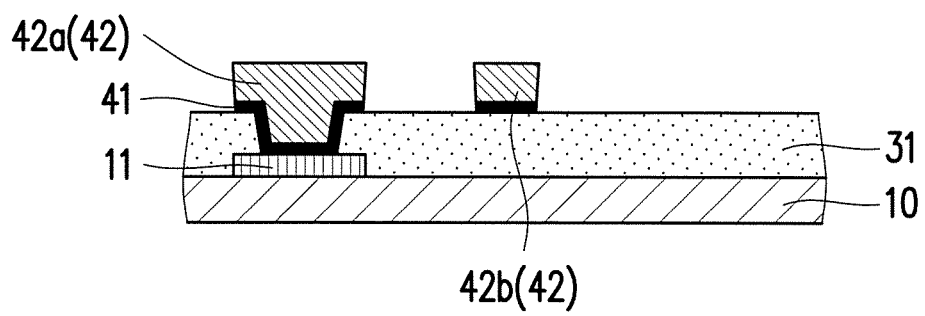

Referring to FIG. 3C and FIG. 3D, after the second conductive layer 42 is formed, the first photoresist layer 51 is removed. Next, the second conductive layer 42 is employed as the mask to remove a portion of the first conductive layer 41 not being covered by the second conductive layer 42. For instance, the first photoresist layer 51 may be removed by plasma asking or etching, but the invention is not limited thereto. In addition, after the first photoresist layer 51 is removed, a first portion 42a and a second portion 42b of the second conductive layer 42 (not shown) may be re-covered by a photoresist layer, and the portion of the first conductive layer 41 not being covered by the photoresist layer (not shown) is removed through etching. In the process, the first portion 42a and the second portion 42b of the second conductive layer 42 are separated from each other.

In terms of structure, the first portion 42a of the second conductive layer 42 and the first conductive layer 41 located below the first portion 42a are equivalent to the contact windows 30a located above the pads 11 in the chip structure 100 in FIG. 2A to FIG. 2C. Moreover, the second portion 42b of the second conductive layer 42 and the first conductive layer 41 located below the second portion 42b are equivalent to each of the protrusions of each of the conductive traces in the chip structure 100 (e.g., the first protrusion 244a included in the second conductive trace 240 and/or the second protrusion 344a and the third protrusion 344b included in the third conductive trace 340).

Figure 3E:
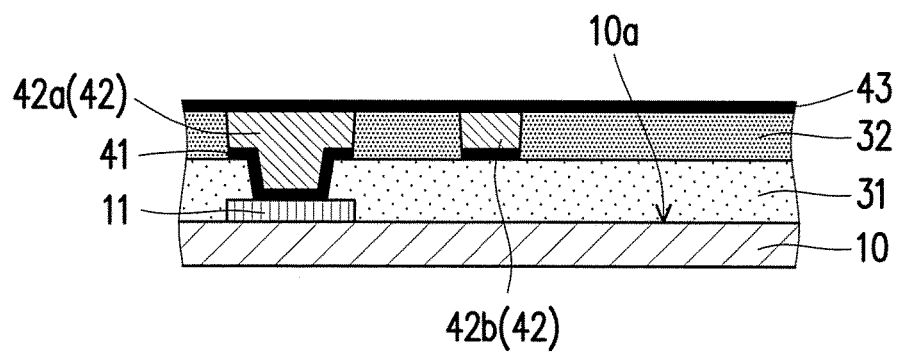

Referring to FIG. 3E, the second dielectric layer 32 is disposed or formed on the first dielectric layer 31 (e.g., the portion of the first dielectric layer 31 not being covered by the first portion 42a and the second portion 42b of the second conductive layer 42). Top surfaces of the first portion 42a and the second portion 42b of the second conductive layer 42 are exposed by the second dielectric layer 32. In the present embodiment, a material of the second dielectric layer 32 and a method of forming the second dielectric layer 32 are similar to the material of the first dielectric layer 31 and the method of forming the first dielectric layer 31, thus, detailed descriptions thereof are not repeated herein. In some embodiments, after the second dielectric layer 32 is manufactured, the planarization process may be applied to a top surface of the second dielectric layer 32, such that the third conductive layer 43 to be formed subsequently may be formed on such planarized surface. Next, the third conductive layer 43 is formed on the second dielectric layer 32 and the second conductive layer 42. A material of the third conductive layer 43 and a method of forming the third conductive layer 43 are similar to the material of the first dielectric layer 41 and the method of forming the first dielectric layer 41, thus, detailed descriptions thereof are not repeated herein.

Figure 3F:
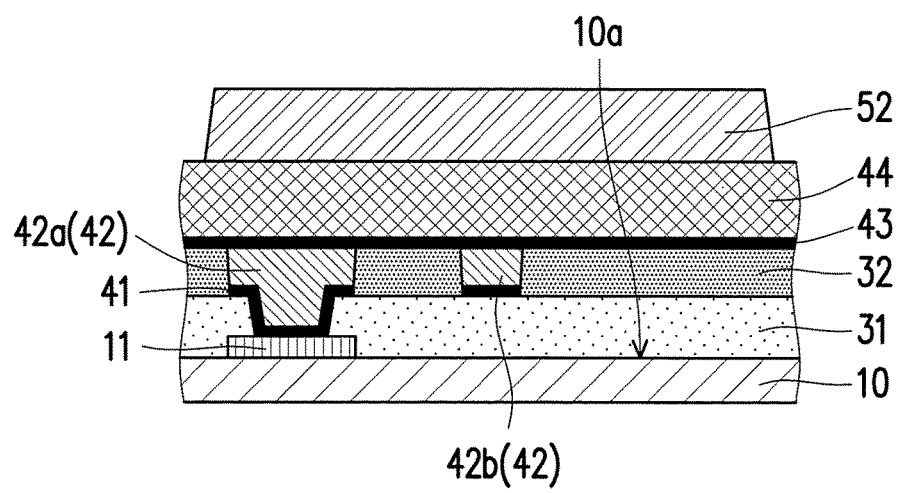

Referring to FIG. 3F, after the third conductive layer 43 is formed, the fourth conductive layer 44 is formed on the third conductive layer 43. A material of the fourth conductive layer 44 and a method of forming the fourth conductive layer 44 are similar to the material of the second conductive layer 42 and the method of forming the second conductive layer 42, thus, detailed descriptions thereof are not repeated herein. Next, a second photoresist layer 52 is formed on the fourth conductive layer 44. The second photoresist layer 52 may be formed by the photolithography process. The second photoresist layer 52 overlaps with the second conductive layer 42, but the second conductive layer 42 is not completely covered by the second photoresist layer 52. For instance, the patterned second photoresist layer 52 may have a plurality of bar-shaped patterns (or conductive trace-shaped patterns). A material of the second photoresist layer 52 and a method of forming the second photoresist layer 52 are similar to the material of the first photoresist layer 51 and the method of forming the first photoresist layer 51, thus, detailed descriptions thereof are not repeated herein.

Figure 3G:
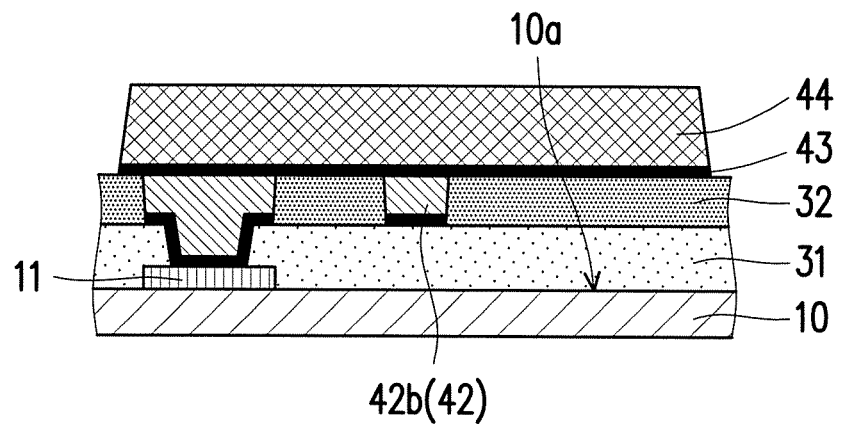

Referring to FIG. 3F and FIG. 3G, after the second photoresist layer 52 is formed, the second photoresist layer 52 is employed as the mask to remove a portion of the fourth conductive layer 44 and a portion of the third conductive layer 43. In some embodiments, the portion of the fourth conductive layer 44 and the portion of the third conductive layer 43 not being covered by the second photoresist layer 52 may be removed through the etching process.

Referring to FIG. 3F and FIG. 3G, after the patterned third conductive layer 43 and the patterned fourth conductive layer 44 are formed, the second photoresist layer 52 is removed (shown in FIG. 3F). A method of removing the second photoresist layer 52 is similar to the method of removing the first photoresist layer 51; thus, detailed descriptions thereof are not repeated herein.

In terms of structure, the patterned fourth conductive layer 44 is equivalent to each of the bodies of each of the conductive traces in the chip structure 100 (e.g. the first body 142 of the first conductive trace 140, the second body 242 of the second conductive trace 240, and/or the third body 342 of the third conductive trace 340).

Figure 3H:
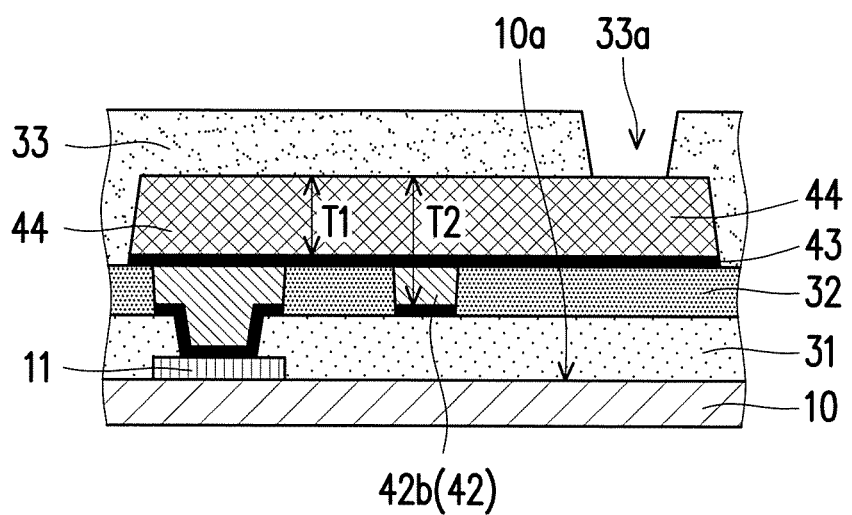

Referring to FIG. 3H, after the second photoresist layer 52 is removed, the third dielectric layer 33 is disposed or formed on the fourth conductive layer 44 and a portion of the second dielectric layer 32 not being covered by the fourth conductive layer 44. Manufacturing of the redistribution layer 20 provided by the present embodiment is substantially completed after going through the foregoing manufacturing process. The third dielectric layer 33 has a plurality of second through holes 33a to at least expose a surface of an end of the fourth conductive layer 44 away from the pad 11. A material of the third dielectric layer 33 and a method of forming the third dielectric layer 33 are similar to the material of the second dielectric layer 32 and the method of forming the second dielectric layer 32, thus, detailed descriptions thereof are not repeated herein.

Referring to FIG. 3H and FIG. 2B, in terns of the manufacturing process, as shown in FIG. 3H and FIG. 2B, the dielectric layer 30 in the redistribution layer 20 includes the first dielectric layer 31, the second dielectric layer 32, and the third dielectric layer 33. In addition, after the manufacturing of the redistribution layer 20 provided by the present embodiment is completed, a plurality of conductive terminals 60 may be formed on the second through holes 33a of the third dielectric layer 33. The conductive terminals 60 may be electrically coupled to the chip 10 through the redistribution layer 20. The conductive terminals 60 may be, for example, solder balls, bumps, conductive pillars, bonding wires, or combinations of the foregoing arranged in array. In the rest of the embodiments, other types of circuit wiring structures may be formed on the redistribution layer 20.

Figure 4:
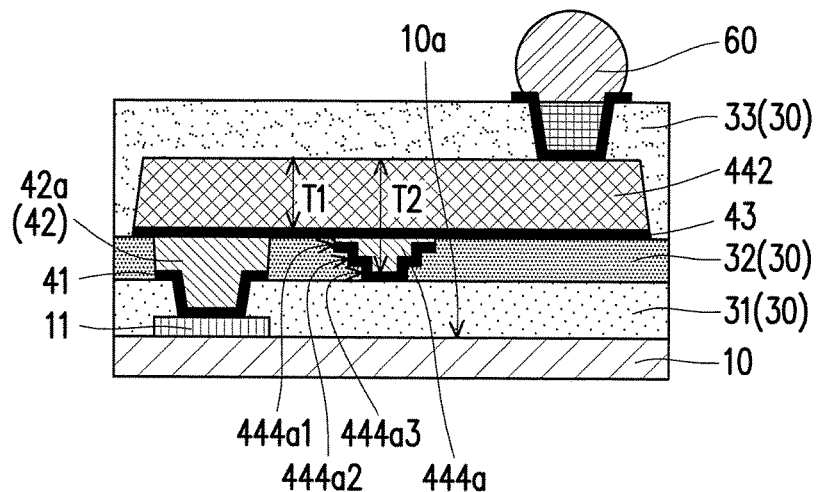
FIG. 4 is a schematic cross-sectional view of a conductive trace according to the second embodiment of the present invention.

FIG. 4 is a schematic cross-sectional view of a conductive trace according to the second embodiment of the present invention. A fourth conductive trace 440 includes a fourth body 442 and a fourth protrusion 444a coupled to the fourth body 442. The fourth protrusion 444a has a first side wall 444a1, a second side wall 444a2, and a third side wall 444a3. The first side wall 444a1, the second side wall 444a2, and the third side wall 444a3 are not aligned with each other. As such, the fourth protrusion 444a may have a structure similar to a stair-shaped structure. In terms of the manufacturing process, the patterning processes may be applied repeatedly to the second dielectric layer 32 to form a similar fourth protrusion 444a.

Figure 5:
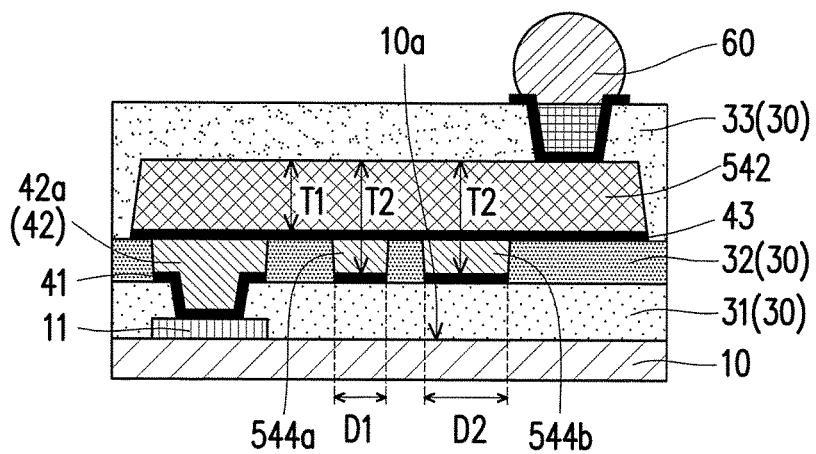
FIG. 5 is a schematic cross-sectional view of a conductive trace according to the third embodiment of the present invention.

FIG. 5 is a schematic cross-sectional view of a conductive trace according to the third embodiment of the present invention. A fifth conductive trace 540 includes a fifth body 542 and a fifth protrusion 544a and a sixth protrusion 544b coupled to the fifth body 542. In the present embodiment, a thickness of a region of the fifth conductive trace 540 including the fifth protrusion 544a and a thickness of a region of the fifth conductive trace 540 including the sixth protrusion 544b are identical. In the present embodiment, the fifth protrusion 544a and the sixth protrusion 544b may have different connecting distances (i.e., contact lengths or widths). In other words, a first connecting distance D1 of the fifth protrusion 544a and a second connecting distance D2 of the sixth protrusion 544b are different. As such, a volume of the fifth protrusion 544a is different from a volume of the sixth protrusion 544b.

The embodiments shown in FIGS. 2B, 2C, 4, and 5 are different ways of adjusting the equivalent parasitic capacitance and/or equivalent parasitic inductance of the conductive traces for matching the delay times of the conductive traces with each other. A combination of the said embodiments may occur in a single chip structure. Or, variations of one of the embodiments shown in FIGS. 2B, FIG. 2C, FIG. 4, and FIG. 5 may occur in a single package structure. The said variation may include variation of width, depth, and/or number of the protrusion in the conductive trace.

To sum up, in the embodiments of the present invention, timing control of the conductive traces may be adjusted as required in design through adjusting the protrusions of the conductive traces.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A chip structure, comprising:
a chip, comprising a plurality of pads; and
a redistribution layer, comprising:
a dielectric layer, deposited on the chip, wherein the dielectric layer has a plurality of contact windows located above the pads; and
a plurality of conductive traces, disposed on the dielectric layer, the conductive traces being electrically coupled to the pads through the contact windows, at least one of the conductive traces comprising a body and at least one protrusion, wherein the at least one protrusion comprises a first end and a second end opposite to the first end, the first end is physically and electrically coupled to an area of the body other than where the contact windows are coupled to on the body, and the second end is encapsulated by the dielectric layer.

2. The chip structure as claimed in claim 1, wherein the conductive traces comprise:
a first conductive trace, comprising a first body; and
a second conductive trace, comprising a second body and the at least one protrusion coupled to the second body, wherein a length of the first body is longer than a length of the second body.

3. The chip structure as claimed in claim 1, wherein the at least one protrusion comprises at least one first protrusion and at least one second protrusion, and the conductive traces at least comprise:
a first conductive trace, comprising a first body and the at least one first protrusion coupled to the first body; and
a second conductive trace, comprising a second body and the at least one second protrusion coupled to the second body.

4. The chip structure as claimed in claim 3, wherein a thickness of the at least one first protrusion is different from a thickness of the at least one second protrusion.

5. The chip structure as claimed in claim 3, wherein a volume of the at least one first protrusion is different from a volume of the at least one second protrusion.

6. The chip structure as claimed in claim 3, wherein a number of the at least one first protrusion is different from a number of the at least one second protrusion.

7. The chip structure as claimed in claim 3, wherein the contact windows and the at least one first protrusion are respectively located on two opposite sides of the first body.

8. The chip structure as claimed in claim 3, wherein the contact windows and the at least one second protrusion are respectively located on two opposite sides of the second body.

9. The chip structure as claimed in claim 3, wherein the contact windows and the at least one first protrusion are located on a same side of the first body.

10. The chip structure as claimed in claim 3, wherein the contact windows and the at least one second protrusion are located on a same side of the second body.

11. The chip structure as claimed in claim 3, wherein a length of the first body is longer than a length of the second body, a volume of the at least one first protrusion is smaller than a volume of the at least one second protrusion.

12. The chip structure as claimed in claim 1, wherein the contact windows and the at least one protrusion are respectively located on two opposite sides of the body.

13. The chip structure as claimed in claim 1, wherein the contact windows and the at least one protrusion are located on a same side of the body.

14. The chip structure as claimed in claim 1, wherein the at least one protrusion extends from the body and is encapsulated in the dielectric layer.

15. The chip structure as claimed in claim 1, wherein the at least one protrusion has a first side wall and a second side wall, the first side wall and the second side wall are not aligned with each other.

16. The chip structure as claimed in claim 1, wherein the at least one protrusion comprises at least one first protrusion and at least one second protrusion, and the conductive traces at least comprise:
    a first conductive trace, comprising a first body; and
    a second conductive trace, comprising a second body, the at least one first protrusion, and the at least one second protrusion, wherein the at least one first protrusion and the at least one second protrusion coupled to the second body.

17. The chip structure as claimed in claim 16, wherein a thickness of the at least one first protrusion is different from a thickness of the at least one second protrusion.

18. The chip structure as claimed in claim 16, wherein a volume of the at least one first protrusion is different from a volume of the at least one second protrusion.

19. The chip structure as claimed in claim 16, wherein a number of the at least one first protrusion is different from a number of the at least one second protrusion.

20. The chip structure as claimed in claim 16, wherein the at least one first protrusion and the at least one second protrusion are located on a same side of the second body.

\* \* \* \* \*